United States Patent [19]

Harvey et al.

[11] Patent Number: 5,413,660

[45] Date of Patent: May 9, 1995

[54] METHOD FOR IMPARTING IMPROVED ADHESION TO POLYOLEFIN SUBSTRATES

[75] Inventors: Noel G. Harvey, North Wales; Theodore D. Goldman, Washington Crossing, both of Pa.; Carl M. Hesler, New Egypt, N.J.

[73] Assignee: Rohm and Haas Company, Philadelphia, Pa.

[21] Appl. No.: 143,420

[22] Filed: Oct. 26, 1993

[51] Int. Cl.$^6$ .............................................. B32B 31/00
[52] U.S. Cl. ................................. 156/243; 156/280; 156/327; 427/412.3; 525/71; 525/94
[58] Field of Search ............... 427/412.3; 156/243, 156/280, 327; 525/71, 94

[56] References Cited

U.S. PATENT DOCUMENTS

| | | | |
|---|---|---|---|
| 4,394,485 | 7/1983 | Adur | 525/71 |
| 4,595,726 | 6/1986 | Klosiewicz | 525/71 |

*Primary Examiner*—John J. Gallagher
*Attorney, Agent, or Firm*—Roger K. Graham

[57] ABSTRACT

Improved adhesion to a polyolefin, especially polypropylene, of substrates of acrylic-based or other protective polymers, in the form of a plastic film, sheet, or coating or a latex or solvent-based paint, ink, or coating is achieved by use of an intermediate layer, laminate, or veneer of a blend of segmented copolymer of a polyolefin and a poly(methacrylate) which is blended with a core/shell copolymer having a crosslinked rubber core.

7 Claims, No Drawings

METHOD FOR IMPARTING IMPROVED ADHESION TO POLYOLEFIN SUBSTRATES

BACKGROUND OF THE INVENTION

1. Field of the Invention

This invention is concerned with means for imparting improved adhesion to a polyolefin, especially polypropylene, of substrates of acrylic-based or other protective polymers, in the form of a plastic film, sheet, or coating or a latex or solvent-based paint, ink, or coating by use of an intermediate layer, laminate, or veneer of a blend of segmented copolymer of a polyolefin and a poly(methacrylate) combined with a core/shell copolymer having a crosslinked rubber core. The invention may be further applied to improve adherence or adhesion of pressure-sensitive adhesives, which adhesives may serve to bond cloth, carpet, non-woven fabrics, plastics, and the like to the improved substrate. The invention is further concerned with means to an improved substrate for adherence of inks and colorants.

2. Description of the Prior Art

Matrix polymers, such as ABS, may be used as substrates for acrylic plastic sheet, film, coatings, inks, or latices, where the latter impart weatherability, decorative effects, printability, and the like, are useful in the assemblage of automobiles and other vehicles, such as automotive interiors, trunks (boots), truck (lorry) cabs, railroad car interiors, van (caravan) trim, and the like, equipment housing, furniture, and the like, where they offer advantages in cost and formability over metal or wood. Unfortunately, when an inexpensive matrix polymer, a polyolefin such as polypropylene or polyethylene, is used the acrylic polymers do not adhere well without special treatment, such as corona discharge or other oxidative treatments of the substrate. Acceptable adhesives or precoatings for the polyolefin prior to application of the acrylic polymer also are not readily available.

Acrylic polymers, more preferably polymers of methyl methacrylate, are useful for this purpose but are expensive and not as tough as certain plastic substrates used in the automotive and other industries. Such acrylic polymers are useful to achieve a combination of adhesion, toughness, and lower cost when combined with a cheaper, tougher polyolefin in a laminar structure (which structure may require a laminating adhesive in the case of polyolefins to prevent delamination), or when the surface of the polyolefin is altered to promote adhesion. This invention relates to improved methods for causing such lamination and/or adherence to occur. Solution of this problem allows combinations of inexpensive polyolefins to be protected, painted, printed, or adhered to in a manner to replace more expensive matrix polymers. Further, in many cases, no additional adhesive need be employed.

In U.S. Pat. No. 4,957,974 is disclosed the use of specific graft copolymers of polyolefins and polymethacrylates, when further blended with polypropylene, as useful for improving printability; the graft copolymers are disclosed as tie layers between otherwise incompatible polymers. In U.S. Pat. No. 5,035,933 is disclosed the use of such graft copolymers as tie layers between polyolefins and certain barrier polymers. These graft or segmented copolymers by themselves or blended with polyolefins, when based on a methyl methacrylate graft, have not been satisfactory in their ability to accept a paint with good adhesion against standard tests.

Thus the art has sought means for adherence of various forms of (meth)acrylic polymers to inexpensive polyolefin substrates as a means for protecting, coloring, or adhering to such polyolefins, without the use of expensive external physical treatment such as corona discharge. In the following text, "film" refers to a continuous plastic matrix less than about 10 mils (units) thick, whilst "sheet" refers to a continuous plastic matrix more than 10 mils (units) thick. "Predominately" has the meaning of at least about 50%.

SUMMARY OF THE INVENTION

To cause adhesion between a non-polar substrate, such as a polyolefin, and a paint, coating, or ink, several methods may be envisaged. One is a tie layer between the polyolefin and the coating, which tie layer must also develop adequate adhesion, the tie layer either directly accepting the paint, coating, or ink, or being used further to adhere a layer of a polar polymer to which adhesion of the paint, ink, or coating may be made. An improvement to this method is to prepare a tie layer or surface coating containing appropriate additive polymers which adhere especially well to the polyolefin.

The difficulty with each of these methods has been to define an appropriate material or materials to act as the tie layer, the additive polymer, the chemical or physical surface alterant, and the like. In the present invention, improved means are shown for achieving such improved adhesion.

Thus, we have found in the process for adhering (meth)acrylic films or laminates to polyolefin substrates, the improvement which comprises:

a) forming a first blended film or sheet of
  (i) from about 5 to about 95 parts per 100 parts of the first film or sheet of a multi-stage polymer containing a crosslinked core, wherein the core is formed predominantly from at least one of butadiene or butyl acrylate, and wherein the second-stage is formed predominantly from methyl methacrylate, and wherein the ratio of first-stage to second-stage polymer is at least 3/2;
  (ii) from about 95 to about 5 parts per 100 parts of the first film or sheet of a segmented polymer having at least one segment of a non-polar polyolefin formed predominately from ethylene or propylene and having at least one polar segment of a polymer formed from at least about 80 weight percent of an alkyl methacrylate, the weight-average molecular weight of all segments being above about 20,000, the ratio of polar segments to non-polar segments being from about 9:1 to about 1:4;

b) applying the first film or sheet under heat and pressure to a polyolefin sheet or film;

c) separately or concurrently applying a (meth)acrylic film or laminate to the first film or sheet.

We have further found in the process for adhering paints, inks, or coatings to polyolefin substrates, the improvement which comprises:

a) forming a first blended film or sheet of
  (i) from about 5 to about 95 parts per 1 00 parts of the first film or sheet of a multi-stage polymer containing a crosslinked core, wherein the core is formed predominantly from at least one of butadiene or butyl acrylate, and wherein the second-stage is formed predominantly from methyl methacrylate, and wherein the ratio of first-stage to second-stage polymer is at least 3/2;

(ii) from about 95 to about 5 parts per 100 parts of the first film or sheet of a segmented polymer having at least one segment of a non-polar polyolefin formed predominately from ethylene or propylene and having at least one polar segment of a polymer formed from at least about 80 weight percent of an alkyl methacrylate, the weight-average molecular weight of all segments being above about 20,000, the ratio of polar segments to non-polar segments being from about 9:1 to about 1:4;

b) applying the first film or sheet under heat and pressure to a polyolefin sheet or film;

c) applying a latex, paint, or ink to the first film or sheet; and d) drying the latex, paint, or ink to an adherent film.

In both of the above processes, it is preferred the polyolefin substrate be polypropylene. Separately, it is preferred the segmented copolymer be a segmented copolymer of polypropylene and a polymer containing at least 80 weight percent of units of methyl methacrylate.

For both processes, the first film or sheet may be co-extruded with the polyolefin sheet or film, or co-injection molded with the polyolefin sheet or film. The polyolefin may be glass-filled polypropylene sheet.

A preferred first multi-stage polymer is that described in U.S. Pat. No. 5,247,024. The polypropylene may contain the additive described in U.S. Pat. No. 4,957,974 for the purposes of improving its melt processing and sag resistance during thermoforming. The tie coat may be applied by methods known to the art. Such methods include extrusion of-the tie-coat onto either the acrylic polymer or the polypropylene, either as a co-extrudate or onto an already formed film, followed by application of the remaining polymer with appropriate temperature and pressure conditions to optimize lamination. Lamination of all three components simultaneously, such as by co- extrusion or co-injection molding of all components, is also possible.

The first film or sheet may be made by conventional means, such as extrusion, calendering, compressing molding, and the like. It may be applied to the polyolefin film or sheet by compression in a press with heat, by application through heated rolls, and the like. Continuous processes for extruding one or both films or sheets, contacting, separating, and re-using the first film or sheet in contact with additional polypropylene may be envisaged.

It should be noted that component (i) of the blend may form a film or sheet under careful processing conditions, but it is very difficult to form such a film or sheet by the variety of molding conditions which may be utilized for forming the blend of components (i) and (ii). Further, such a film or sheet solely from component (i) will not laminate adequately to the polyolefin sheet or film. The addition of component (ii) aids in lamination to the polyolefin but it also serves as a carrier or flow aid for component (i) so the blend can be injection molded or extruded under a variety of conditions.

A film solely from component (ii) can be formed fairly readily and will exhibit adequate adhesion to the polyolefin; it is deficient, however, in exhibiting acceptable adhesion to the (meth)acrylic film or laminate or to a latex, paint, or ink. Component (i) is required to promote that required adhesion.

The resulting laminates may be painted, adhered to carpet, printed, and the like. They may be thermoformed into useful objects of commerce and transportation, such as machine housings, containers, automotive parts, and the like.

Printability to polyolefin injection molded parts or extruded or blown polyolefin films may be improved, for use in containers, bags, and the like. Paintability of exterior automobile parts, such as fenders, spoilers, rocker panels, and blow-molded bumpers may be improved. Injection molded substrates of polypropylene will exhibit better adhesion to foam-in-place polyurethane foam. Polyolefin pipe when so modified may be a more adherent surface for printing, labeling, application of coatings, such as insulation, and the like.

Printability of synthetic paper based on polyolefins may be enhanced, as may be the adhesion of printable polyolefin films to plastic containers, where the labels are added after molding. The concept will be useful in packaging with bi- and multilayer composite films of polyolefins. Construction of circuit boards onto a polypropylene substrate may be enhanced when the substrate is modified with an acrylic surface.

The embedded particulate material when combined with a film of the segmented copolymer will be useful as a tie-coat, or as a co-extruded or co-injection molded surface on the polyolefin substrate to which an acrylic or methacrylic-based coating, film, or paint, or indeed other solvent-based paints, inks, lacquers, and the like, such as a polyurethane coating, can be applied with excellent adhesion. In both these related processes, a preferred polyolefin is polypropylene, including glass-filled polypropylene sheet, and it is also preferred the segmented copolymer be a segmented copolymer of polypropylene and a polymer containing at least 80 weight percent of units of methyl methacrylate. Both processes are effective when the first film or sheet is co-extruded or co-injection molded with the polyolefin sheet or film.

EXAMPLE 1

Process for Tie-Layer Film or Sheet

This example describes one way in which a tie-layer may be utilized, although it is not the tie-layer of the present invention. A polymer, preferably made by the process of U.S. Pat. No. 5,247,024, of the composition of Example 69 of U.S. Pat. No. 4,957,974 is processed into a 10 mil (0.254 mm.) film by compression molding the polymer (240 degrees C., ca. 20 metric tons). The film is then used as a tie-layer in a laminate between films prepared in a similar manner of (a) a polypropylene homopolymer of MFR 0.8, and (b) a poly(methyl methacrylate) of MW ca. 125,000. Here testing for adhesion is conducted as follows: a polypropylene floc carpet backed with a pressure-sensitive adhesive believed to be a butadiene-styrene polymer combined with a separate layer of the glycerol ester of colophony rosin is adhered to various plastics substrates under a pressure of 2000 psi ( 14000 kPa). Samples are oven-aged at 39 degrees C. for 12 hours, and then tested within 5 minutes of removal from the oven at 50% relative humidity on a Zwick tensile tester at 300 mm./min. peel rate. The adhesion to the composite is equivalent to that for an acrylic monolithic substrate, surpassing the performance of either polypropylene or ABS. No delamination at the surface or between acrylic and polypropylene is noted.

EXAMPLES 2-5

Preparation of a Blended Film with Enhanced Adhesion to Polypropylene

Films are prepared by dry-blending powders in ratios of 9:1 and of 1:9 of a butyl acrylate/methyl methacrylate core-shell polymer of particle size 8 microns of the composition of Example 69 of U.S. Pat. No. 4,957,974 (Modifier A) and a segmented polypropylene/poly(methyl methacrylate/butyl acrylate copolymer (95/5) polymer containing 59 weight % polypropylene, prepared by the process of Example 7 of U.S. Pat. No. 5,237,004 (Carrier A). The dry-blended powders are melt-blended and extruded into pellets at 204°-218 ° C. Films are compression-molded from pellets to a thickness of 5-20 mils (0.12-0.50 mm.) at 204°-210 ° C. for one minute at 14-140 mPa, and then laminated as in Example 3 to a polypropylene surface. Excellent retention of a solvent-based lacquer (100%) is observed, using the ASTM D 3359-78 cross-hatch test.

Testing results on the blend film without lamination to a polypropylene substrate are mixed; excellent retention of a solvent-based lacquer (100% ) is observed, using the ASTM D 3359-78 cross-hatch test. With an automotive polyurethane paint, in one test facility poor adhesion is observed, but in another excellent retention of adhesion is seen for both the automotive polyurethane and a melamine polyester.

It is noted that these blends have rheological properties acceptable for co-injection molding with polyolefins, that is, the melt properties of the blend at temperatures close to the temperature at which the polyolefin base is injection-molded show a higher melt viscosity than the polyolefin base, but not so high that co-processing cannot occur.

In a similar manner, the blended films are laminated to a thermoplastic polyolefin (TPO), and excellent adhesion of a solvent-based lacquer paint is observed by the same ASTM test. When a film formed solely from the composition of Example 69 is tested as a control, no adhesion of the paint is observed in any of the tests.

EXAMPLE 6

Preparation of a Blended Film for Adherence to a Thermoplastic Polyolefin

A film is prepared from a polypropylene modified with an ethylene-propylenediene elastomer. The films taught in Example 2 are laminated to the impact-modified polypropylene. Good adherence of a solvent-based lacquer paint (95% and 98% retention) is observed to the laminated veneer which adheres well to the impact-modified polypropylene substrate. However, when the ratios of carrier/additive are extended, it is seen that outstanding adhesion of the solvent-based acrylic paint is found only at the ends of the compositional range. When a film formed solely from the composition of Example 69 is tested as a control, no adhesion is observed in the tests.

| Additive | Ratio, Carrier/Additive | Cross-Hatch, % Retention (solvent-based acrylic) |
|---|---|---|
| A | 9/1 | 95 |
| A | 8/2 | 20 |
| A | 7/3 | 20 |
| A | 6/4 | 20 |
| A | 5/5 | 0 |
| A | 4/6 | 15 |
| A | 3/7 | 40 |
| A | 2/8 | 55 |
| A | 1/9 | 98 |

EXAMPLE 7

Further Examples of Improved Paintability of Thermoplastic Polyolefin

In these Examples, other multistage core/shell polymers were used to achieve a similar effect. Modifier B is a core/shell polymer based on a cross-linked butyl acrylate core (75 parts) with 25 parts of a methyl methacrylate/acryloxypropionic (95/5) copolymeric shell. Modifier C is a core/shell polymer based on a cross-linked butadiene/styrene core staged first with styrene and then with methyl methacrylate, stabilized with antioxidants. It is noted that these blends have rheological properties acceptable for co-injection molding with polyolefins, that is, the melt properties of the blend at temperatures close to the temperature at which the polyolefin base is injection-molded show a higher melt viscosity than the polyolefin base, but not so high that co-processing cannot occur.

They were blended with Carrier A at various ratios, laminated to a thermoplastic polyolefin based on polypropylene and ethylene/propylene rubber, treated with a urethane coating, and then tested for adhesion of the coating to the veneer or laminate formed from the blend. Results are shown below. When a film formed solely from the composition of Example 69 is tested as a control, no adhesion is observed in any of the tests.

| Additive | Ratio, Carrier/Additive | Cross-Hatch, % Retention |
|---|---|---|
| B | 9/1 | 6 |
| B | 8/2 | 0 |
| B | 7/3 | 0 |
| B | 6/4 | 4 |
| B | 5/5 | 17 |
| B | 4/6 | 40 |
| B | 3/7 | 93 |
| B | 2/8 | 100 |
| B | 1/9 | 100 |
| C | 9/1 | 91 |
| C | 8/2 | 96 |
| C | 7/3 | 25 |
| C | 6/4 | 25 |
| C | 5/5 | 15 |
| C | 4/6 | 20 |
| C | 3/7 | 2 |
| C | 2/8 | 30 |
| C | 1/9 | 96 |

EXAMPLE 8

Treatment of Various Blends of Core/shell Polymers/Segmented Copolymers directly with Coatings In this example, direct painting by an automotive polyurethane is done on the blends without lamination to the TPO substrate.

| Additive | Ratio, Carrier/Additive | Cross-Hatch, % Retention |
|---|---|---|
| B | 2/8 | 100 |
| C | 1/9 | 100 |
| — | 100/0 | 0 |

We claim:

1. In the process for adhering (meth)acrylic films or laminates to polyolefin substrates, the improvement which comprises:
  a) forming a first blended film or sheet of
    (i) from about 5 to about 95 parts per 100 parts of the first film or sheet of a multi-stage polymer containing a polymer core as a first stage, wherein the core is formed predominantly from at least one of butadiene or butyl acrylate, and wherein a second-stage polymer is formed predominantly from methyl methacrylate, and wherein the ratio of first-stage to second-stage polymer is at least 3/2;
    (ii) from about 95 to about 5 parts per 100 parts of the first film or sheet of a segmented polymer having at least one segment of a non-polar polyolefin formed predominately from ethylene or propylene and having at least one polar segment of a polymer formed from at least about 80 weight percent of an alkyl methacrylate, the weight-average molecular weight of all segments being above about 20,000, the ratio of polar segments to non-polar segments being from about 9:1 to about 1:4;
  b) applying the first film or sheet under heat and pressure to a polyolefin sheet or film;
  c) separately or concurrently applying a (meth)acrylic film or laminate to the first film or sheet.

2. In the process for adhering paints, inks, or coatings to polyolefin substrates, the improvement which comprises:
  a) forming a first blended film or sheet of
    (i) from about 5 to about 95 parts per 100 parts of the first film or sheet of a multi-stage polymer containing a polymer core as a first stage, wherein the core is formed predominantly from at least one of butadiene or butyl acrylate, and wherein a second-stage polymer is formed predominantly from methyl methacrylate, and wherein the ratio of first-stage to second-stage polymer is at least 3/2;
    (ii) from about 95 to about 5 parts per 100 parts of the first film or sheet of a segmented polymer having at least one segment of a non-polar polyolefin formed predominately from ethylene or propylene and having at least one polar segment of a polymer formed from at least about 80 weight percent of an alkyl methacrylate, the weight-average molecular weight of all segments being above about 20,000, the ratio of polar segments to non-polar segments being from about 9:1 to about 1:4;
  b) applying the first film or sheet under heat and pressure to a polyolefin sheet or film;
  c) applying a latex, paint, or ink to the first film or sheet; and
  d) drying the latex, paint, or ink to an adherent film.

3. The process of claims 1 or 2 wherein the polyolefin is polypropylene.

4. The process of claims 1 or 2 wherein the segmented copolymer is a segmented copolymer of polypropylene and a polymer containing at least 80 weight percent of units of methyl methacrylate.

5. The process of claims 1 or 2 wherein the first film or sheet is co-extruded with the polyolefin sheet or film.

6. The process of claims 1 or 2 wherein the first film or sheet is co-injection molded with the polyolefin sheet or film.

7. The process of claims 1 or 2 wherein the polyolefin is glass-filled polypropylene sheet.

* * * * *

UNITED STATES PATENT AND TRADEMARK OFFICE
CERTIFICATE OF CORRECTION

PATENT NO. : 5,413,660

DATED : May 9, 1995

INVENTOR(S) : Noel G. Harvey, Theodore D. Goldman, Carl M. Hesler

It is certified that error appears in the above-identified patent and that said Letters Patent is hereby corrected as shown below:

Please correct claim 1 (i), column 7, line 7 to read:

containing a crosslinked polymer core as a first stage,

Please correct claim 2 (i), column 7, line 35 to read:

containing a crosslinked polymer core as a first stage,

Signed and Sealed this

Twelfth Day of September, 1995

Attest:

BRUCE LEHMAN

*Attesting Officer*  *Commissioner of Patents and Trademarks*